US010892600B1

United States Patent
Serkland et al.

(10) Patent No.: US 10,892,600 B1
(45) Date of Patent: Jan. 12, 2021

(54) NARROW-LINEWIDTH SINGLE-MODE VERTICAL-CAVITY SURFACE-EMITTING LASER

(71) Applicant: National Technology & Engineering Solutions of Sandia, LLC, Albuquerque, NM (US)

(72) Inventors: Darwin K. Serkland, Albuquerque, NM (US); Michael Wood, Albuquerque, NM (US); Alejandro J. Grine, Albuquerque, NM (US); Gregory M. Peake, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 0 days.

(21) Appl. No.: 16/541,237

(22) Filed: Aug. 15, 2019

(51) Int. Cl.
*H01S 5/10* (2006.01)
*H01S 5/183* (2006.01)
*H01S 5/227* (2006.01)
*H01S 5/125* (2006.01)

(52) U.S. Cl.
CPC ............ *H01S 5/183* (2013.01); *H01S 5/1021* (2013.01); *H01S 5/125* (2013.01); *H01S 5/2275* (2013.01)

(58) Field of Classification Search
None
See application file for complete search history.

(56) References Cited

U.S. PATENT DOCUMENTS

| 2005/0123014 A1* | 6/2005 | Shimizu | H01S 5/18313 372/45.01 |
| 2006/0164636 A1* | 7/2006 | Islam | G01N 21/658 356/301 |
| 2011/0064110 A1* | 3/2011 | Gerlach | H01S 5/0264 372/50.21 |

FOREIGN PATENT DOCUMENTS

WO    WO2006136346    * 12/2006

OTHER PUBLICATIONS

D. K. Serkland et al., "All-Semiconductor Coupled-Cavity VCSELs for Narrow Linewidth," 2018 IEEE International Semiconductor Laser Conference (ISLC), Santa Fe, NM, 2018, pp. 1-2, doi: 10.1109/ISLC.2018.8516182. (Year: 2018).*

(Continued)

*Primary Examiner* — Michael Carter
(74) *Attorney, Agent, or Firm* — Mark A. Dodd

(57) ABSTRACT

A coupled-cavity vertical-cavity surface-emitting laser (VCSEL) is disclosed. The coupled-cavity VCSEL includes a passive cavity and an additional distributed Bragg Reflector (DBR) not found in conventional VCSELs, all in a monolithic device. By including these two elements, the photon lifetime may be increased by a factor of approximately ten, leading to a reduction in the laser linewidth by a factor of approximately 100 compared to conventional VCSELs. The two additional elements also serve to ensure single-mode operation of the coupled-cavity VCSEL.

20 Claims, 5 Drawing Sheets

(56) References Cited

OTHER PUBLICATIONS

Asplund, C. et al., "Doping-induced losses in AlAs/GaAs distributed Bragg reflectors," Journal of Applied Physics (2001) 90(2):794-800.
Henry, C. H., "Theory of the Linewidth of Semiconductor Lasers," IEEE Journal of Quantum Electronics (1982) QE-18(2):259-264.
Schawlow, A. L. et al., "Infrared and Optical Masers," Physical Review (1958) 112(6):1940-1949.
Serkland, D. K. et al., "Fully micro-fabricated Vecsel at 850nm," Proc. of SPIE (2011) 7952, 8 pages.
Serkland, D. K. et al., "Narrow Linewidth VCSELs for High-Resolution Spectroscopy," Proc. of SPIE (2009) 7229, 8 pages.

* cited by examiner

NARROW-LINEWIDTH SINGLE-MODE VERTICAL-CAVITY SURFACE-EMITTING LASER

STATEMENT OF GOVERNMENT INTEREST

This invention was made with Government support under Contract No. DE-NA0003525 awarded by the United States Department of Energy/National Nuclear Security Administration. The Government has certain rights in the invention.

TECHNICAL FIELD

The present invention relates to a vertical-cavity surface emitting laser (VCSEL) having a coupled-cavity design that results in narrow-linewidth single-mode lasing in a monolithic device.

BACKGROUND

A vertical-cavity surface-emitting laser (VCSEL) is a type of semiconductor laser in which the laser beam is emitted from the top surface of the device, this contrasts with an edge-emitting laser in which the laser beam is emitted from the edge of the device. VCSELs have found widespread use, with some example applications including computer mice, optical communication systems, and laser printers.

The resonator portion of a VCSEL typically includes two distributed Bragg reflector (DBR) mirrors parallel to the surface of the wafer with an intervening active or gain region. The active region typically includes one or more quantum wells for the generation of laser light. The planar DBR mirrors are formed of material layers with alternating high and low refractive indices. Each DBR mirror may include fifteen or more periods of the alternating high and low refractive index material layers. Each layer has a thickness of a quarter of the operating wavelength in the material (or an odd multiple thereof), resulting in the DBR mirrors having reflectivities of greater than 95%, typically on the order of 98% or greater. High reflectivity mirrors are needed in VCSELs to balance the short axial length of the active region.

In VCSELs, the upper and lower DBR mirrors are typically doped as p-type and n-type materials, forming a diode junction. In more complex VCSEL structures, the p-type and n-type regions may be placed between the DBR mirrors, thereby forming intra-cavity contacts, requiring a more complex semiconductor process to make electrical contact to the active region. One benefit of this more complex VCSEL structure is that it eliminates electrical power loss in the DBR mirror structures.

VCSELs operating at wavelengths from 650 nm to 1300 nm are typically based on gallium arsenide (GaAs) wafers with DBR mirrors formed from alternating layers of aluminum gallium arsenide $(Al_xGa_{(1-x)})As$ or AlGaAs having two different aluminum mole fractions. The GaAs—AlGaAs system is favored for constructing VCSELs because the lattice constant of the GaAs—AlGaAs material system does not vary strongly as the composition is changed, allowing multiple lattice-matched epitaxial layers to be grown on a GaAs substrate. Further, the refractive index of AlGaAs rapidly decreases as the aluminum mole fraction increases, thereby minimizing the number of layers needed to form an efficient DBR mirror compared to other candidate material systems. In addition, at high aluminum mole fractions, an oxide can be formed from AlGaAs, and this oxide can be used to restrict the drive current in a VCSEL by forming a current aperture, enabling very low threshold currents.

Longer wavelength VCSELs, operating from 1300 nm to 2000 nm, have been demonstrated, with at least the active region typically made of InGaAs matched to an indium phosphide substrate. 1310 nm VCSELs are desirable as the dispersion in silica-based optical fibers, as used in optical communication systems, is at a minimum in this wavelength range.

One drawback to traditional VCSELs is lasing at multiple wavelengths due to the active region supporting multiple transverse modes. Another drawback to traditional VCSELs is a broad-linewidth due to the short cavity length. These drawbacks are incompatible with the narrow-linewidths and single-mode operation needed for various applications, including, for example, small, low-power atomic sensors, including atomic clocks, magnetometers, and gyroscopes. Thus, the need exists for VCSELs having narrow-linewidths and single-mode operation.

SUMMARY

One aspect of the present invention relates to a coupled-cavity VCSEL design that can achieve laser linewidths that are orders of magnitude narrower than prior art VCSEL designs. The inventors of the present invention designed and fabricated a narrow-linewidth single-mode coupled-cavity VCSEL and measured a laser linewidth of less than 1.0 MHz, which is much narrower than a typical VCSEL linewidth of 50 MHz.

One design feature for achieving narrow-linewidth VCSELs is to increase the photon lifetime in the overall laser cavity. One way to achieve longer photon lifetimes is to add a passive cavity within the overall laser cavity wherein photons circulate for longer times. Unlike conventional designs, the optical electric field is higher in the passive cavity than within the active region of the VCSEL. The passive cavity maintains modal purity as it prevents all but a single longitudinal mode from lasing. To achieve single-mode operation, all other modes, whether polarization, transverse, and longitudinal, of the overall laser cavity must have a higher threshold current than the fundamental optical mode.

As described above, a prior art VCSEL consists of a bottom DBR mirror, an active region, and a top DBR mirror. In certain embodiments of the present invention, a middle DBR mirror of modest reflectivity and a passive cavity are added to the prior art VCSEL design, while maintaining a monolithic structure. These two additional elements permit photons to circulate in the passive cavity between the bottom and middle DBR mirrors. In one embodiment of the present invention, the photons circulate approximately 4 round trips in the passive cavity for each time they circulate through the active region. The net effect is an increase in the photon lifetime in the compound-cavity VCSEL compared to a prior art VCSEL, and hence a decrease in the "cold-cavity" linewidth. As the lasing linewidth scales as the square of the cold-cavity linewidth, any decrease in the cold-cavity linewidth due to the passive cavity quadratically decreases the lasing linewidth.

One aspect of the present invention relates to a coupled-cavity VCSEL having a very highly reflective bottom reflector; a passive cavity formed on the bottom reflector, the passive cavity having a thickness corresponding to an integer multiple of one half of the operating wavelength in the passive cavity; a moderately reflective middle reflector formed on the passive cavity; an active region formed on the middle reflector, the active region providing optical gain at the operating wavelength; and a highly reflective top reflector formed on the active region, the top reflector transmitting the optical output when the coupled-cavity VCSEL is operating.

Additional aspects of the present invention relate to coupled-cavity VCSELs having a bottom reflector formed of a DBR with a reflectivity of at least approximately 99.9%; coupled-cavity VCSELs having a middle reflector formed of a DBR with a reflectivity of between approximately 70% and approximately 85%; and coupled-cavity VCSELs having a top reflector formed of a DBR with a reflectivity of between approximately 99.3% and approximately 99.6%.

Other aspects of the present invention relate to coupled-cavity VCSELs in which at least the middle reflector, the active region, and the top reflector are formed of at least one of II-VI semiconductor material, III-V semiconductor material, and IV semiconductor material; coupled-cavity VCSELs in which the bottom reflector and the passive cavity are formed of at least one of II-VI semiconductor material, III-V semiconductor material, and IV semiconductor material; coupled-cavity VCSELs in which the bottom reflector and the passive cavity are formed of at least one dielectric material; and coupled-cavity VCSELs in which the semiconductor materials used to form each of the middle reflector, the active region, and the top reflector are substantially lattice matched.

Yet other aspects of the present invention relate to coupled-cavity VCSELs in which at least a portion of the middle reflector is doped a first type and the top reflector is doped a second, opposite type and coupled-cavity VCSELs in which at least a portion of the passive cavity and the middle reflector are doped a first type and the top reflector is doped a second, opposite type.

Still other aspects of the present invention relate to coupled-cavity VCSELs in which the passive cavity has a thickness corresponding to at least twice or four times the operating wavelength in the passive cavity.

Other aspects of the present invention relate to coupled-cavity VCSELs including additional features, such as bottom/top contacts in electrical contact with the active region with the bottom/top contacts adapted to provide a drive current to the active region; a current aperture adapted to limit the flow of drive current in the active region, with the current aperture formed in a perimeter portion of the top reflector adjacent the active region; or bottom/top doped layers located between the middle/top reflectors and the active region with the bottom/top contacts adapted to provide a drive current to the active region.

Yet other aspects of the present invention relate to coupled-cavity VCSELs in which the middle reflector includes a lower, undoped plurality of layers, a middle, doped single composition layer formed on the lower, undoped plurality of layers, and an upper, doped plurality of layers formed on the middle, doped single composition layer; coupled-cavity VCSELs in which the top reflector includes a lower, doped plurality of layers, a middle, doped single composition layer formed on the lower, doped plurality of layers, and an upper, undoped plurality of layers formed on the middle, doped single composition layer; and coupled-cavity VCSELs in which these middle reflectors and top reflectors are adapted to provide a drive current to the active region.

Still other aspects of the present invention relate to coupled-cavity VCSELs in which the passive cavity has an index of refraction greater than approximately 1.4.

Features from any of the disclosed embodiments may be used in combination with one another, without limitation. In addition, other features and advantages of the present disclosure will become apparent to those of ordinary skill in the art through consideration of the following detailed description and the accompanying drawings.

BRIEF DESCRIPTION OF THE DRAWINGS

The drawings illustrate several embodiments of the invention, wherein identical reference numerals refer to identical or similar elements or features in different views or embodiments shown in the drawings. The drawings are not to scale and are intended only to illustrate the elements of various embodiments of the present invention.

DETAILED DESCRIPTION

Figure 1:
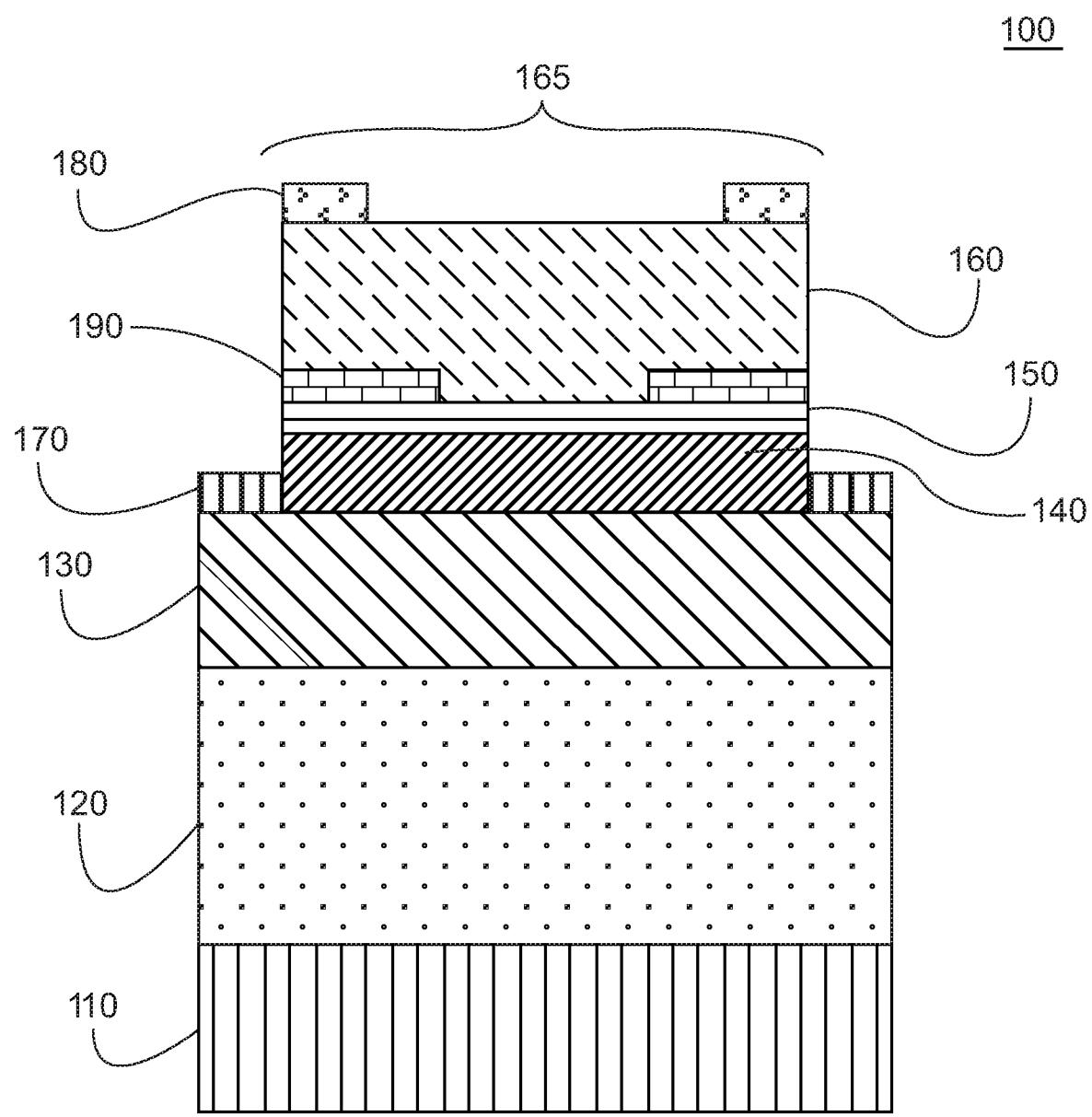
FIG. 1 illustrates a cross-section of coupled-cavity VCSEL in accordance with one or more embodiments of the present invention.

FIG. 1 illustrates a cross-section of a coupled-cavity VCSEL 100 in accordance with at least one embodiment of the present invention. The coupled-cavity VCSEL 100 is formed on a substrate 110. A bottom DBR mirror 120 is formed on the substrate 110, followed by a passive cavity 130. A middle DBR mirror 140 is formed on the passive cavity 130 and is followed by an active region 150. A top DBR mirror 160 is formed on the active region 150. After etching to form a mesa 165, a bottom contact 170 is formed on the passive cavity 130 and is in electrical contact with the middle DBR mirror 140. A top contact 180 is formed on and is in electrical contact with the top DBR mirror 160. The coupled-cavity VCSEL 100 further includes a current aperture 190. As shown in FIG. 1, the coupled-cavity VCSEL 100 is monolithic in that it has no external elements and can be formed directly from a single semiconductor wafer. As also shown in FIG. 1, each element of the coupled-cavity VCSEL 100 is planar, i.e., each element of the coupled-cavity VCSEL 100 has a substantially infinite radius of curvature.

The substrate 110 may be any suitable substrate including a semiconductor wafer, for example a GaAs, or other III-V material, wafer, or a processed semiconductor wafer with one or more integrated circuits or one or more microelectromechanical systems (MEMS) formed thereon. The substrate 110 is preferably a semiconductor substrate that is substantially lattice matched to the materials used to form the rest of the coupled-cavity VCSEL 100.

The bottom DBR mirror 120 comprises a plurality of alternating high and low index of refraction layers and may have any suitable combination of compositions and thicknesses. The compositions of the high and low index of refraction layers are preferably selected to result in a significant difference in the index of refraction to thereby minimize the overall number of alternating high and low index of refraction layers, and thus the time needed to grow the bottom DBR mirror 120 on the substrate 110. In general, the reflectivity of the bottom DBR mirror 120 is a function of the number of periods, with more periods providing greater reflectivity. As a reflectivity of approximately 99.9% or more is preferred, the number of periods is typically greater than 30, depending upon the composition of the layers employed. In the working examples discussed below, the bottom DBR mirror 120 includes 42 periods of $Al_{0.16}Ga_{0.84}As$—$Al_{0.92}Ga_{0.08}As$.

Another consideration regarding selection of the compositions of the high and low index of refraction layers in the bottom DBR mirror 120 is the desire to minimize the difference in the lattice constants between the layers, whether they be in the bottom DBR mirror 120 or elsewhere in the overall structure of the coupled-cavity VCSEL 100. Lattice-matched structures provide many benefits including improved reliability due to fewer dislocations in the crystal structure, which can also improve overall efficiency as such dislocations may create current sinks and increase optical scattering and optical absorption.

The suitable thickness of the individual layers forming the bottom DBR mirror 120 is a function of both the operating wavelength and the index of refraction of the layer at the operating wavelength. Specifically, the thickness of each individual layer is preferably equal to one quarter of the operating wavelength in the layer (or an odd multiple thereof). Perhaps more importantly, the overall period of each pair of high and low index of refraction layers is preferably equal to one half of the operating wavelength (or an odd multiple thereof).

The passive cavity 130 may have any suitable composition and thickness, subject to selecting a composition and thickness that preferably minimizes optical loss and optical scattering within the passive cavity 130. As with the bottom DBR mirror, the composition of the passive cavity 130 is preferably selected to minimize the difference in its lattice constant compared to that of the rest of the materials employed in the coupled-cavity VCSEL 100. The suitable thickness of the passive cavity 130 is a function of both the operating wavelength and the index of refraction of the passive cavity 130 material at the operating wavelength. Specifically, the thickness of the passive cavity 130 is preferably substantially equal to an integer multiple of one half the operating wavelength in the passive cavity 130. The passive cavity 130 more preferably has a thickness substantially equal to at least four times the operating wavelength in the passive cavity 130, and most preferably has a thickness substantially equal to at least eight times the operating wavelength in the passive cavity 130. The greater the integer multiple employed, the narrower the resultant linewidth, though this must be balanced against the thickness of the overall coupled-cavity VCSEL 100, and thus total growth time, as well as the optical loss and optical scattering within the passive cavity 130. In the working examples discussed below, the passive cavity 130 is eight wavelengths thick and is formed of AlGaAs having an aluminum mole fraction of 0.16.

The passive cavity 130 may also be doped to simplify fabrication. For example, one may etch the mesa 165 down into the passive cavity 130 as this simplifies processing and leads to a higher yield as one need not stop at the interface between the passive cavity 130 and the middle DBR mirror 140. This approach is used with the first working example discussed below, in which the passive cavity 130 is doped n-type to a level of $1\times10^{18}$ cm$^{-3}$. In the second working example discussed below, the passive cavity 130 is unintentionally doped, with a resultant n-type dopant level of $3.3\times10^{17}$ cm$^{-3}$.

The middle DBR mirror 140 comprises a plurality of alternating high and low index of refraction layers and may have any suitable combination of compositions and thicknesses. The design criteria for the bottom DBR mirror 120 generally apply to the middle DBR mirror 140, with two exceptions. The first exception is that the reflectivity of the middle DBR mirror 140 should be far more modest than that of the bottom DBR 120, for example, between 2% and 70%, and more preferably between 15% to 30%. In the first (second) working examples discussed below, the middle DBR mirror 140 includes four (three) layers of $Al_{0.92}Ga_{0.08}As$ and three (two) intervening layers of $Al_{0.16}Ga_{0.84}As$, with the passive cavity 130 having a composition of $Al_{0.16}Ga_{0.84}As$ and the adjacent portion of the active region 150 having a composition of $Al_{0.2}Ga_{0.8}As$.

The second exception relates to the fact that the middle DBR mirror 140 may also serve as an electrical contact for the active region 150. For this reason, the middle DBR mirror 140 is doped. In the first working example discussed below, the middle DBR mirror 140 is doped n-type to a level of $1\times10^{18}$ cm$^{-3}$ in the $Al_{0.16}Ga_{0.84}As$ layers and $1.5\times10^{18}$ cm$^{-3}$ in the $Al_{0.92}Ga_{0.08}As$ layers. In the second working example discussed below, the middle DBR mirror 140 is doped n-type to a level of $3.3\times10^{17}$ cm$^{-3}$ in the $Al_{0.16}Ga_{0.84}As$ layers and $5\times10^{17}$ cm$^{-3}$ in the $Al_{0.92}Ga_{0.08}As$ layers.

The active region 150 preferably comprises one or more quantum wells of alternating wider and narrower bandgap layers (barriers and wells, respectively), and may have any suitable combination of compositions and thicknesses. The design of the active region 150 is similar to that in conventional VCSELs. See, for example, Vertical-Cavity Surface-Emitting Lasers: Design, Fabrication, Characterization, and Applications, Cambridge Studies in Modern Optics, C. Wilmsen Ed., (2001), the contents of which are incorporated herein by reference, for a description of active region design. In the working examples discussed below, the active region 150 includes three quantum wells each having a width of 80 Å and a composition of GaAs, with two intervening barriers each having a width of 80 Å and a composition of $Al_{0.2}Ga_{0.8}As$, the outer barriers have a composition of $Al_{0.2}Ga_{0.8}As$. The overall thickness of the active region 150 is substantially equal to an integer multiple of one-half the operating wavelength in the active region 150. In the working examples described below, the two outer barriers of the active region 150 have both a constant composition spacer layer and a graded composition spacer layer. The constant composition spacer layers are adjacent to the quantum wells and have a composition of $Al_{0.2}Ga_{0.8}As$ and each has a thickness of approximately 52 nm. The graded composition spacer layers have a composition of $Al_{0.2}Ga_{0.8}As$ adjacent to constant composition layer and are graded to a composition of approximately $Al_{0.56}Ga_{0.44}As$ adjacent to the middle DBR mirror 140 and the top DBR mirror 160, and each has a thickness of approximately 52 nm. The total thickness of the active region, including the three quantum wells, the two intervening barriers, the two constant composition spacer layers, and the two graded composition layers is approximately 249 nm.

The top DBR mirror 160 comprises a plurality of alternating high and low index of refraction layers and may have any suitable combination of compositions and thicknesses. The design criteria for the bottom DBR mirror 120 generally apply to the top DBR mirror 160, with two exceptions. The first exception is that the reflectivity of the top DBR mirror 160 should be slightly less than that of the bottom DBR 120, and preferably in the range of 99.0% to 99.7%, as the optical output of the coupled-cavity VCSEL 100 leaves through the top DBR mirror. In the working examples discussed below, the top DBR mirror 160 includes 21 periods of $Al_{0.16}Ga_{0.84}As/Al_{0.92}Ga_{0.08}As$.

The second exception relates to the fact that the top DBR mirror 160, like the middle DBR mirror 140, may serve as an electrical contact for the active region 150. For this reason, the top DBR mirror 160 is doped. In the working examples discussed below, the top DBR mirror 160 is doped p-type to a level of $1 \times 10^{18}$ cm$^{-3}$.

After growth of the overall crystal structure corresponding to the bottom DBR mirror 120, the passive cavity 130, the middle DBR mirror 140, the active region 150, and the top DBR mirror 160, the wafer undergoes additional processing to form the final coupled-cavity VCSEL 100. This processing includes etching down to the top surface of the passive cavity 130, thereby forming a mesa 165. After etching the mesa 165, the bottom contact 170 is deposited on the top surface of the passive cavity 130, thereby providing electrical contact to both the passive cavity 130 and the middle DBR mirror 140. The bottom contact 170 is preferably an annular ring around the mesa 165 formed by the unetched portion of the middle DBR mirror 140, the active region 150, and the top DBR mirror 160. The bottom contact 170 may be formed of any suitable metal and thickness and may comprise one or more layers. In the working examples discussed below, the bottom contact 170 is formed of germanium/gold/nickel/gold (GeAuNiAu) having thicknesses of 26 nm, 54 nm, 20 nm, and 250 nm, respectively.

The current aperture 190 is formed around the perimeter of the mesa 165 in the top DBR mirror 160, and preferably in the lower portion of the top DBR mirror 160. The current aperture 190, which is a high resistance region, forces the drive current to pass through the center of the mesa 165, thereby increasing the gain in the corresponding portion of the active region 150 for a given drive current. The current aperture 190 may be formed by various means, such as implanting hydrogen, or, if the top DBR mirror 160 includes aluminum, oxidizing the desired portion of the top DBR mirror 160. In the two working examples discussed below, a thin $Al_{0.98}Ga_{0.02}As$ layer in the top DBR mirror 160 but close to the active region 150 was oxidized to form the current aperture 190.

The top contact 180 is deposited on the top of the mesa 165 in physical and electrical contact with the top DBR mirror 160. The top contact 180 is preferably an annular ring around the perimeter of the mesa 165. The top contact 180 may be formed of any suitable metal and thickness and may comprise one or more layers. In the working examples discussed below, the top contact 180 is formed of titanium/platinum/gold (TiPtAu) having thicknesses of 20 nm, 20 nm, and 200 nm, respectively.

In the above described embodiment of the present invention, the bottom DBR mirror 120, the passive cavity 130, the middle DBR mirror 140, the active region 150, and the top DBR mirror 160 may be formed of various III-V semiconductor material. In other embodiments of the present invention, the bottom DBR mirror 120, the passive cavity 130, the middle DBR mirror 140, the active region 150, and the top DBR mirror 160 may be formed of various II-VI or IV semiconductor material. In still other embodiments of the present invention, the bottom DBR mirror 120, the passive cavity 130, the middle DBR mirror 140, the active region 150, and the top DBR mirror 160 may be formed of combinations of various II-VI, III-V, and/or IV semiconductor material.

While the above described embodiment of the present invention employed semiconductor material for the bottom DBR mirror 120 and the passive cavity 130, this is not required. In certain embodiments of the present invention, the passive cavity 130 may be formed of materials with lower optical losses or less temperature sensitivity. Such materials include, for example, various dielectric materials, such as $SiO_2$, $Si_3N_4$, $TiO_2$, $Ta_2O_5$, etc. Thus, unlike some prior art coupled-cavity VCSEL designs, the passive cavity 130 of the present invention is not air (or vacuum). See, for example, D. K. Serkland et al., "Full micro-fabricated VECSEL at 850 nm," Proceedings of SPIE, vol. 7952, pp. 79520L-1-79520L-8 (2011), the contents of which are incorporated herein by reference, for a discussion of a coupled-cavity VCSEL in which the coupled-cavity is air. Therefore, the passive cavity of various embodiments of the present invention has an index of refraction greater than 1.0, and preferably has an index of refraction of greater than 1.4.

In some embodiments of the present invention, the middle DBR mirror 140 may be only partially doped. For example, the middle DBR layer may include an upper, doped plurality of alternating high and low index of refraction layers, a middle, doped single composition layer, and a lower, undoped plurality of alternating high and low index of refraction layers. This intra-reflector contact design could reduce the electrical resistance of the middle DBR mirror 140, thereby increasing overall coupled-cavity VCSEL 100. The thickness of the middle, doped single composition layer would need to be sufficient that one could reliably etch down to, but not through this middle, doped single composition layer. The top DBR mirror 160 could employ a similar intra-reflector contact design.

In other embodiments of the present invention, the middle DBR mirror 140 and the top DBR 160 are not intentionally doped. In these embodiments, a bottom doped layer (not shown) is formed between the middle DBR mirror 140 and the active region 150. Similarly, a top doped layer (not shown) is formed between the active region 150 and the top DBR mirror 160. By employing bottom and top doped layers, the power losses due to the resistances of the middle DBR mirror 140 and the top DBR mirror 160 are eliminated. In embodiments employing the bottom and top doped layers, the current aperture 190 may be formed around the perimeter of the mesa 165 in the top doped layer, and preferably in the lower portion of the top doped layer. Alternatively, the current aperture 190 may be formed around the perimeter of the mesa 165 in the bottom doped layer, and preferably in the upper portion of the bottom doped layer.

While the above described embodiment of the present invention included an n-type doped middle DBR mirror 140 and a p-type doped top DBR mirror 160, the doping could be inverted, i.e., the middle DBR mirror 140 is doped p-type and the top DBR mirror 160 is doped n-type. This inverted design has at least one drawback relative to the above described embodiment of the present invention. This drawback is due to the lower mobility of the p-type carriers that must travel a longer lateral distance in the middle DBR mirror 140, a distance that may readily approach or exceed 10 µm. This lower mobility results in an increase in the overall resistance of the coupled-cavity VCSEL 100, resulting in reduced efficiency. In contrast, for the coupled-cavity VCSEL 100 described above, the p-type carriers must travel a much shorter lateral distance, perhaps only a few microns.

While the bottom DBR mirror 120, the middle DBR mirror 140, and the top DBR mirror 160 may be formed of step changes between the high and low index of refraction layers, this is not required. For example, in the working examples discussed below, the bottom DBR mirror 120, the middle DBR mirror 140, and the top DBR mirror 160 are formed of parabolically changing compositions. These parabolically changing compositions offer various benefits, of which improved carrier transport is perhaps the most important. Specifically, by using parabolically changing compositions, the electrical resistance of the middle DBR mirror 140 and the top DBR mirror 160 are reduced. This improves overall efficiency of the coupled-cavity VCSEL 100 when the drive current must pass through the middle DBR mirror 140 and/or the top DBR mirror 160.

As will be appreciated by a person of ordinary skill in the art, the design for the overall structure of the coupled-cavity VCSEL 100 should preferably have a high thermal conductivity to remove heat from the active region 150. As will also be appreciated by a person of ordinary skill in the art, the design for the overall structure of the coupled-cavity VCSEL 100 should preferably have minimal optical absorption and optical scattering to improve overall efficiency of the coupled-cavity VCSEL 100.

Figure 2A:
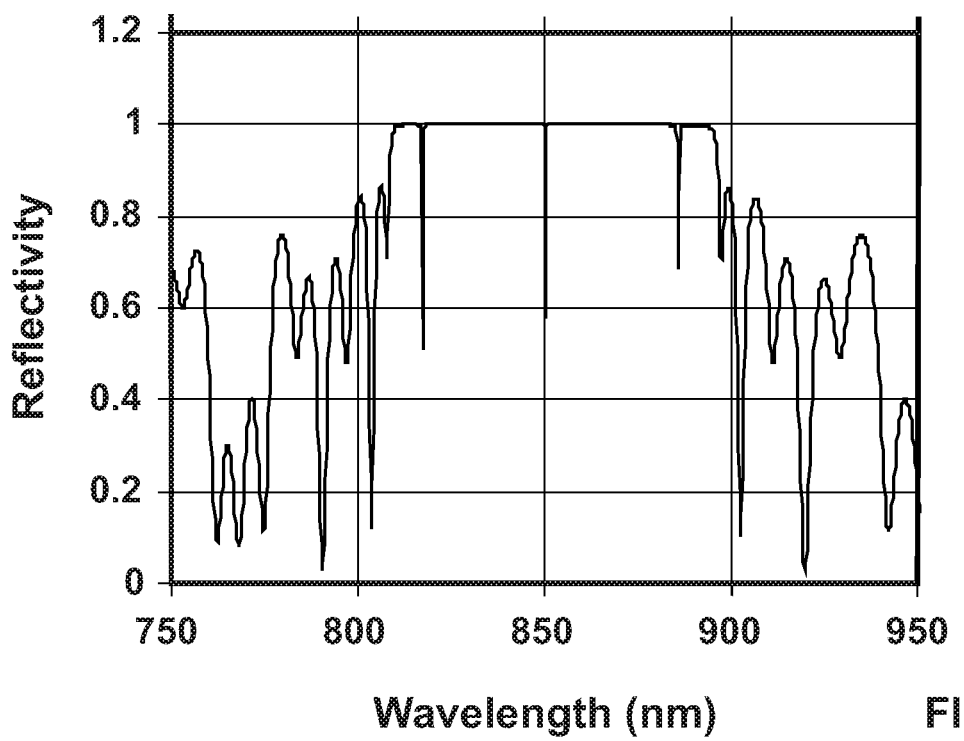
FIGS. 2A and 2B illustrate the simulated and measured reflection versus wavelength spectrum of a first working example coupled-cavity VCSEL in accordance with one or more embodiments of the present invention.
Figure 2B:
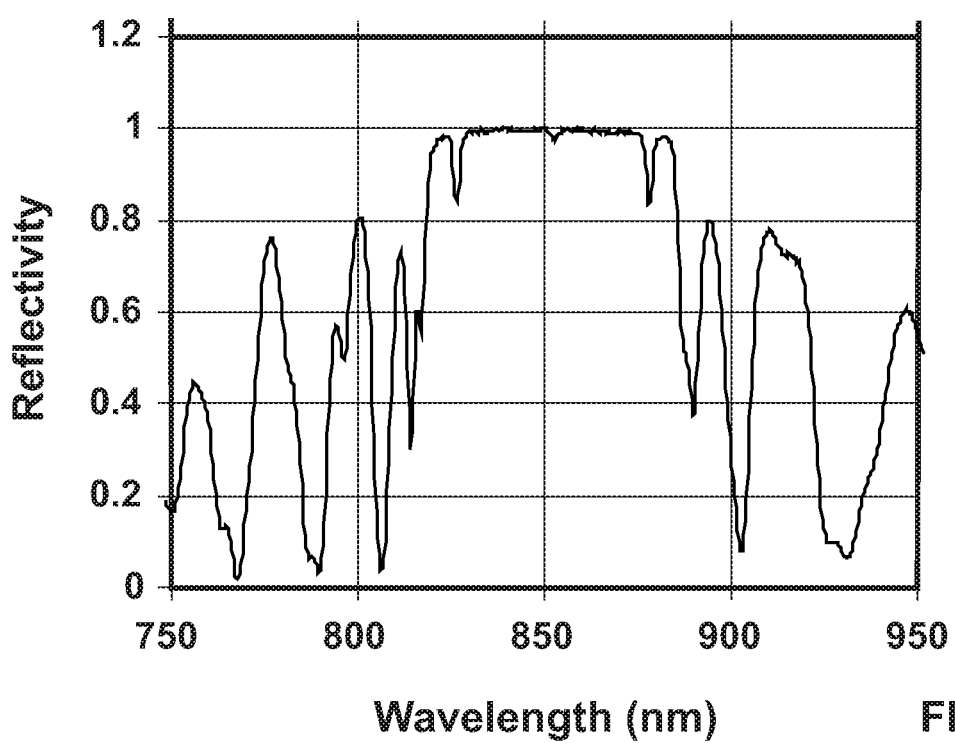

A transmission matrix simulation of the entire coupled-cavity VCSEL structure of the first working example coupled-cavity VCSEL yields the reflection versus wavelength spectrum shown in FIG. 2A. This simulation shows the coupled-cavity VCSEL structure has a cold-cavity linewidth of 34 pm. In contrast, a conventional VCSEL with a 1-wavelength active region and a 21-period top DBR has a cold-cavity linewidth of approximately 210 pm, which is 6 times wider than that of the coupled-cavity VCSEL. According to the Schawlow-Townes linewidth formula, the lasing linewidth scales as the square of the cold-cavity linewidth. See, for example, A. L. Schawlow and C. H. Townes, "Infrared and Optical Masers," Physical Review, vol. 112, pp. 1940-1949 (1958) and C. H. Henry, "Theory of the linewidth of semiconductor lasers," IEEE Journal of Quantum Electronics, vol. QE-18, pp. 259-264 (1982), the contents of each of which are incorporated herein by reference, for a discussion of lasing and cold-cavity linewidths. The first working example is therefore expected to have a lasing linewidth that is 36 times narrower than the conventional VCSEL linewidth of 40 MHz. See, for example, D. K. Serkland et al., "Narrow Linewidth VCSELs for High-Resolution Spectroscopy," Proceedings of the SPIE, vol. 7229, article 722907 (2009), the contents of which are incorporated herein by reference, for a discussion of linewidths in conventional VCSELs. FIG. 2B shows the measured reflection spectrum of the first working example as-grown coupled-cavity VCSEL wafer, using a spectrometer having a resolution of 1 nm. FIG. 2B confirms the expected 38-nm free-spectral range of the passive cavity.

Figure 3A:
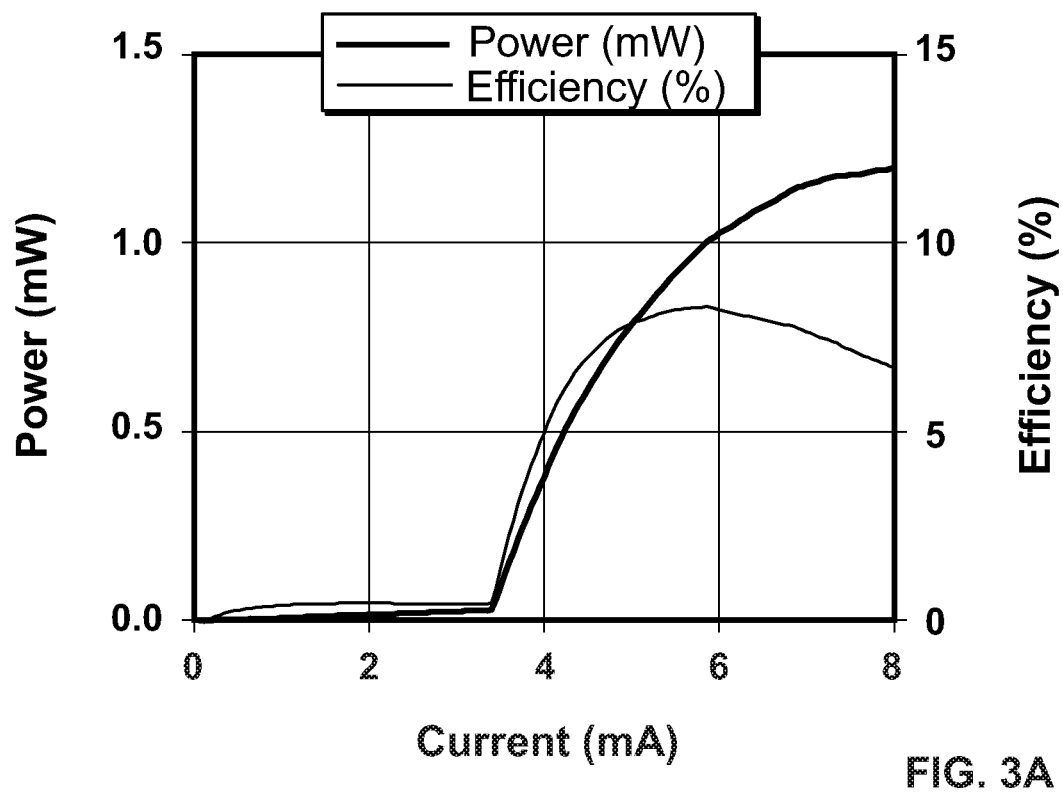
FIG. 3A shows the measured power v. drive current and efficiency v. drive current data
Figure 3B:
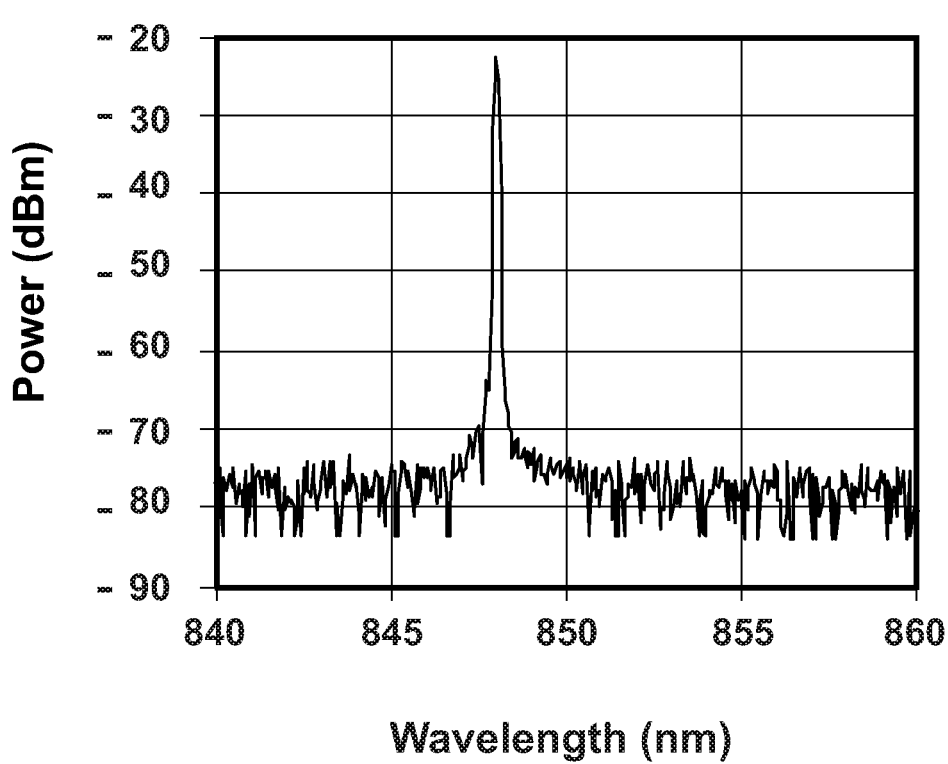
FIG. 3B shows the single-frequency lasing spectrum at 6 mA drive current of the first working example coupled-cavity VCSEL in accordance with one or more embodiments of the present invention.

FIG. 3A shows the measured power v. drive current and efficiency v. drive current data for the first working example coupled-cavity VCSEL and shows a threshold current of 3.4 mA, a peak output power of 1.2 mW, a peak efficiency of greater than 8%, and a slope efficiency of 0.59 W/A. The first working example showed single-mode operation up to the maximum applied current of 8 mA. FIG. 3B shows the single-frequency lasing spectrum at 6 mA drive current, measured with a resolution bandwidth of 0.1 nm. The side-mode spacing was approximately 0.35 nm and the side-mode suppression ratio was over 40 dB. Performance of the first working example was limited by the optical losses (absorption and/or scattering) in the passive cavity. See, for example, C. Asplund et al., "Doping-induced losses in AlAs/GaAs distributed Bragg reflectors," Journal of Applied Physics, vol. 90, pp. 794-800 (2001), the contents of which are incorporated herein by reference, for a discussion of material losses in VCSEL structures.

The second working example coupled-cavity VCSEL yielded a measured linewidth of 0.3 MHz. In the second working example, the photons complete approximately 4 round trips in the passive cavity for each time they circulate through the active region. This resulted in an increase in the photon lifetime in second working example by a factor of eight compared to a prior art VCSEL, and hence to a decrease the cold-cavity linewidth by a factor of 8. Since the lasing linewidth scales as the square of the cold-cavity linewidth, the laser linewidth of the second working example decreased by a factor of 64, all other parameters being equal, compared to a prior art VCSEL.

Figure 4:
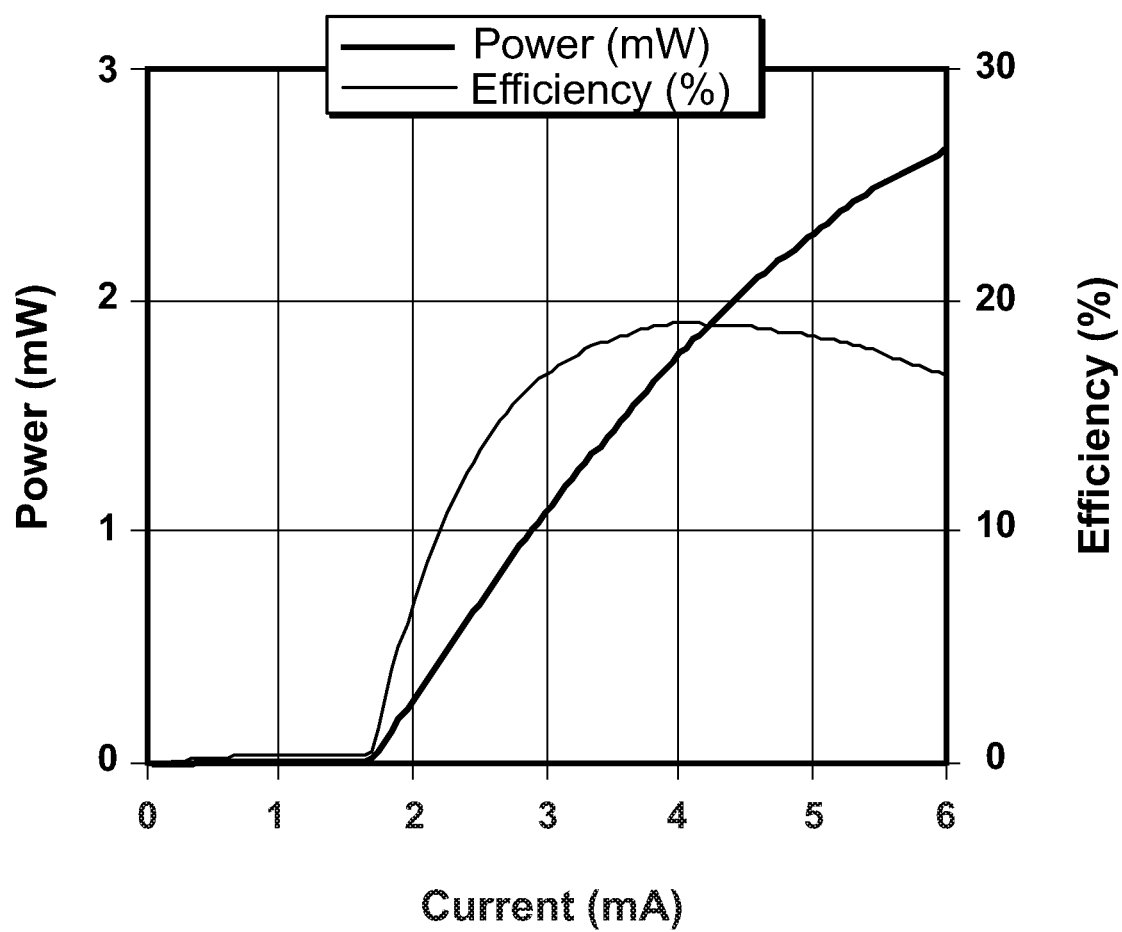
FIG. 4 shows the measured power v. drive current and efficiency v. drive current data for the second working example coupled-cavity VCSEL in accordance with one or more embodiments of the present invention.

The primary differences between the first and second working examples were the doping levels in the bottom DBR mirror 120, the passive cavity 130, and the middle DBR mirror 140. Specifically, the doping levels were reduced to study the effect doping had on optical losses (absorption and/or scattering) on overall performance of the coupled-cavity VCSEL. In the second working example, both the bottom DBR mirror 120 and the passive cavity 130 were unintentionally doped. As shown in FIGS. 3A and 4, reducing the doping in the second working example significantly reduced the optical losses, thereby significantly improving both output power and efficiency.

FIG. 4 shows the measured power v. drive current and efficiency v. drive current data for the second working example coupled-cavity VCSEL. FIG. 4 shows a threshold current of 1.7 mA, a peak output power of greater than 2.7 mW, a peak efficiency of greater than 19%, and a slope efficiency of 0.74 W/A.

Figure 5:
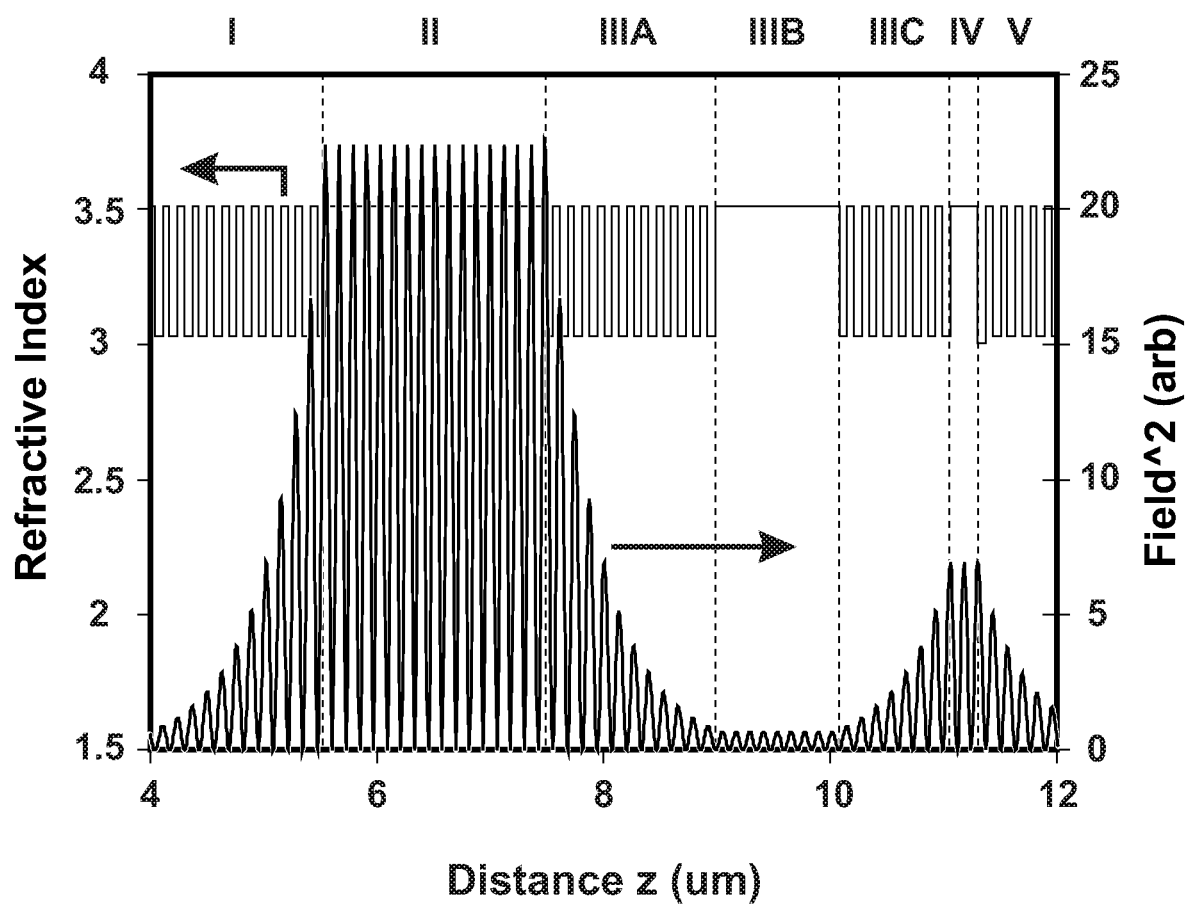
FIG. 5 shows the magnitude of the square of the electric field as a function of position based on a simulation of a third working example.

FIG. 5 shows the refractive index and the square of magnitude of the electric field ($|E|^2$) within a third working example as a function of vertical position within the device. The third working example includes a bottom DBR mirror 120, a passive cavity 130, a three-part middle DBR mirror 140, an active region 150, and a top DBR mirror 160, denoted by "I," "II," "IIIA," "TIM," "IIIC," "IV," and "V," respectively. In the third working example, the bottom DBR mirror 120 has 42 periods (only a portion of which is shown), the passive cavity has a thickness of eight wavelengths, the active region 150 has a thickness of one wavelength, and the top DBR mirror 160 has 21 periods (only a portion of which is shown). The three-part middle DBR mirror 140 includes an undoped lower DBR mirror portion IIIA adjacent the passive cavity 130 with 11 periods, a doped contact portion IIIB having a constant composition, and a doped upper DBR mirror portion IIIC adjacent the active region 150 with 7 periods. While the doped contact portion IIIB has a thickness of four wavelengths, it may have any thickness corresponding to an integer multiple of one-half the operating wavelength in the highly doped contact portion IIIB.

As shown, $|E|^2$ decays rapidly within the relatively thick and highly reflective bottom DBR mirror 120. Similarly, $|E|^2$ decays rapidly within the relatively thick and highly reflective top DBR mirror 160. $|E|^2$ within the passive cavity 130 remains essentially constant at its maximum value. $|E|^2$ in the middle DBR 140 lower DBR mirror portion IIIA and upper DBR mirror portion IIIC decays to a constant value within the doped contact portion IIIB.

One practical feature of various embodiments of the present invention is that the coupled-cavity VCSELs can be fabricated using virtually the same process flow currently used to make prior art VCSELs. The only significant difference is in the semiconductor epitaxial growth, with various embodiments of the present invention needing an additional 25% of semiconductor epitaxial material, corresponding to the passive cavity 130 and the middle DBR mirror 140. This increases the total epitaxial growth thickness from about 8 μm to about 10 However, because the epitaxial growth process is highly automated, implementing this change is relatively easy, as it simply requires changing a growth input file. The required thicker structure results in an increase in the growth time from approximately 3.5 to approximately 4.4 hours. As a relatively minor change in the epitaxial growth can reduce laser linewidth by two orders of magnitude, various embodiments of the present invention are commercially viable using existing equipment and procedures.

The invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

The invention claimed is:

1. A coupled-cavity vertical-cavity surface-emitting laser comprising:
    a bottom reflector adapted to be very highly reflective at an operating wavelength;
    a passive cavity formed on the bottom reflector, the passive cavity having a thickness substantially equal to an integer multiple of one half of the operating wavelength in the passive cavity;
    a middle reflector formed on the passive cavity, the middle reflector adapted to be moderately reflective at the operating wavelength;
    an active region formed on the middle reflector, the active region adapted to provide optical gain at the operating wavelength; and
    a top reflector formed on the active region, the top reflector adapted to be highly reflective at the operating wavelength, the top reflector adapted to transmit an optical output when the coupled-cavity vertical-cavity surface-emitting laser is operating.

2. The coupled-cavity vertical-cavity surface-emitting laser of claim 1, wherein the bottom reflector is a distributed Bragg reflector and has a reflectivity at the operating wavelength of at least approximately 99.9%.

3. The coupled-cavity vertical-cavity surface-emitting laser of claim 1, wherein the middle reflector is a distributed Bragg reflector, and has a reflectivity at the operating wavelength between approximately 15% and approximately 30%.

4. The coupled-cavity vertical-cavity surface-emitting laser of claim 1, wherein the top reflector is a distributed Bragg reflector, and has a reflectivity at the operating wavelength between approximately 99.0% and approximately 99.7%.

5. The coupled-cavity vertical-cavity surface-emitting laser of claim 1, wherein each of at least the middle reflector, the active region, and the top reflector comprises at least one of II-VI semiconductor material, III-V semiconductor material, and IV semiconductor material.

6. The coupled-cavity vertical-cavity surface-emitting laser of claim 5, wherein each of the bottom reflector and the passive cavity comprises at least one of II-VI semiconductor material, III-V semiconductor material, and IV semiconductor material.

7. The coupled-cavity vertical-cavity surface-emitting laser of claim 6, wherein at least a portion of the passive cavity and the middle reflector are doped a first type and the top reflector is doped a second, opposite type.

8. The coupled-cavity vertical-cavity surface-emitting laser of claim 5, wherein each of the bottom reflector and the passive cavity comprises at least one dielectric material.

9. The coupled-cavity vertical-cavity surface-emitting laser of claim 5, wherein the semiconductor materials used to form each of the middle reflector, the active region, and the top reflector are substantially lattice matched.

10. The coupled-cavity vertical-cavity surface-emitting laser of claim 5, wherein at least a portion of the middle reflector is doped a first type and the top reflector is doped a second, opposite type.

11. The coupled-cavity vertical-cavity surface-emitting laser of claim 1, wherein the integer multiple is at least four.

12. The coupled-cavity vertical-cavity surface-emitting laser of claim 11, wherein the integer multiple is at least eight.

13. The coupled-cavity vertical-cavity surface-emitting laser of claim 1, further comprising:
    a bottom contact in electrical contact with the active region; and
    a top contact in electrical contact with the active region;
    wherein the bottom contact and the top contact are adapted to provide a drive current to the active region.

14. The coupled-cavity vertical-cavity surface-emitting laser of claim 1, further comprising a current aperture adapted to limit a flow of a drive current in the active region.

15. The coupled-cavity vertical-cavity surface-emitting laser of claim 14, wherein the current aperture is formed in a perimeter portion of the top reflector adjacent the active region.

16. The coupled-cavity vertical-cavity surface-emitting laser of claim 1, further comprising:
    a bottom doped layer located between the middle reflector and the active region; and
    a top doped layer located between the active region and the top reflector;
    wherein the bottom doped layer and the top doped layer are adapted to provide a drive current to the active region.

17. The coupled-cavity vertical-cavity surface-emitting laser of claim 1,
    wherein the middle reflector includes:
        a first lower, undoped plurality of layers;
        a first middle, doped single composition layer formed on the first lower, undoped plurality of layers; and
        a first upper, doped plurality of layers formed on the first middle, doped single composition layer.

18. The coupled-cavity vertical-cavity surface-emitting laser of claim 17,
    wherein the top reflector includes:
        a second lower, doped plurality of layers;
        a second middle, doped single composition layer formed on the second lower, doped plurality of layers; and a second upper, undoped plurality of layers formed on the second middle, doped single composition layer.

19. The coupled-cavity vertical-cavity surface-emitting laser of claim 18, wherein the middle reflector and the top reflector are adapted to provide a drive current to the active region.

20. The coupled-cavity vertical-cavity surface-emitting laser of claim 1, wherein the passive cavity has an index of refraction greater than approximately 1.4.

* * * * *